(12) United States Patent
Hashimoto

(10) Patent No.: US 9,099,608 B2
(45) Date of Patent: Aug. 4, 2015

(54) MANUFACTURING METHOD FOR SOLAR MODULE

(71) Applicant: Sanyo Electric Co., Ltd., Moriguchi, Osaka (JP)

(72) Inventor: Haruhisa Hashimoto, Minoh (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/159,051

(22) Filed: Jan. 20, 2014

(65) Prior Publication Data

US 2014/0134777 A1    May 15, 2014

Related U.S. Application Data

(63) Continuation of application No. PCT/JP2012/056858, filed on Mar. 16, 2012.

(30) Foreign Application Priority Data

Jul. 26, 2011   (JP) .................. 2011-163342

(51) Int. Cl.
*H01L 21/00* (2006.01)
*H01L 31/18* (2006.01)
*H01L 31/048* (2014.01)

(52) U.S. Cl.
CPC .......... *H01L 31/1876* (2013.01); *H01L 31/048* (2013.01); *Y02E 10/50* (2013.01)

(58) Field of Classification Search
CPC ... H01L 31/05; H01L 31/1876; H01L 31/188; H01L 31/042

USPC ......... 438/64, 67; 136/243, 244; 156/60, 166, 156/307.1, 307.7
See application file for complete search history.

(56) References Cited

U.S. PATENT DOCUMENTS

| 5,593,532 | A | 1/1997 | Falk et al. | |
|---|---|---|---|---|
| 8,298,363 | B2 * | 10/2012 | Hashimoto et al. | 156/307.7 |
| 2004/0171187 | A1 * | 9/2004 | Kataoka et al. | 438/64 |
| 2008/0061111 | A1 | 3/2008 | Kiriyama | |
| 2008/0295956 | A1 * | 12/2008 | Damm et al. | 156/285 |
| 2010/0018646 | A1 | 1/2010 | Metzger | |
| 2010/0181011 | A1 | 7/2010 | Hashimoto et al. | |

FOREIGN PATENT DOCUMENTS

| EP | 2169725 A1 | 3/2010 |
|---|---|---|
| JP | 2006088511 A | 4/2006 |
| JP | 2008-153578 | 7/2008 |
| JP | 2010-12786 | 1/2010 |
| WO | 9429106 | 12/1994 |
| WO | WO-2009-011209 | 1/2009 |

* cited by examiner

*Primary Examiner* — Scott B Geyer
(74) *Attorney, Agent, or Firm* — Marvin A. Motsenbocker; Mots Law, PLLC

(57) ABSTRACT

Provided is a method for manufacturing solar modules with an improved yield. A heat and pressure applying step is performed in which an opposing solar cell (10) and wiring member (11) with a resin adhesive (21) interposed between them are heated while applying pressure. After the heat and pressure applying step has been performed, a cooling step is performed in which the solar cell (10) and the wiring member (11) are cooled while applying pressure.

7 Claims, 2 Drawing Sheets

MANUFACTURING METHOD FOR SOLAR MODULE

CROSS-REFERENCE TO RELATED APPLICATIONS

This is a continuation of International Application PCT/JP2012/056858, with an international filing date of Mar. 16, 2012, filed by applicant, the disclosure of which is hereby incorporated by reference in its entirety.

FIELD OF THE INVENTION

The present invention relates to a method for manufacturing a solar module.

BACKGROUND

Interest in solar modules equipped with a plurality of solar cells connected electrically by a wiring member as an energy source with a low environmental impact has increased in recent years. A method is described in Patent Document 1 in which solar cells and a wiring member are bonded during the manufacture of a solar module by interposing a resin adhesive between the solar cells and the wiring member and applying heat and pressure using a bonding tool.

PRIOR ART DOCUMENTS

Patent Documents

Patent Document 1: WO2009/011209 A1

SUMMARY

Problem Solved by the Invention

However, further improvement in yields is expected from solar module manufacturing methods.

Means of Solving the Problem

The solar module manufacturing method in the present invention relates to a manufacturing method for a solar module in which solar cells are connected electrically by a wiring member. The solar module manufacturing method of the present invention has a heat and pressure applying step and a cooling step. In the heat and pressure applying step, heat and pressure are applied to a solar cell and a wiring member opposing each other with a resin adhesive interposed between them. In the cooling step, the solar cell and the wiring member are cooled under pressure after the heating and pressure applying step has been completed.

Effect of the Invention

The present invention is able to provide a method for manufacturing solar modules with an improved yield.

DETAILED DESCRIPTION

Figure 1:
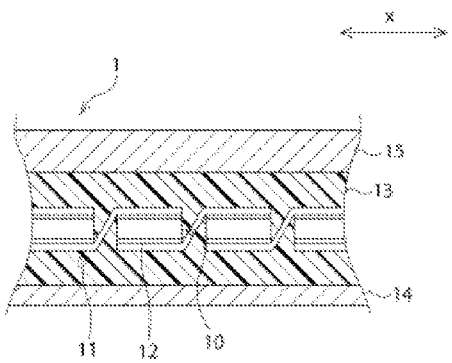
FIG. 1 is a simplified cross-sectional view of the solar module manufactured in an embodiment.

The following is an explanation of examples of preferred embodiments of the present invention. The following embodiments are merely examples. The present invention is not limited by the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

As shown in FIG. 1, the solar module 1 manufactured in the embodiment includes a plurality of solar cells 10. There are no restrictions on the type of solar cell 10. The solar cells 10, for example, may include a substrate made of a semiconductor material such as silicon. The solar cells 10 may be back contact solar cells in which the p-side electrode and the n-side electrode are arranged on a single main surface, or may be solar cells in which the p-side electrode is arranged on one main surface, and the n-side electrode is arranged on the other main surface.

The plurality of solar cells 10 are connected electrically by a wiring member 11. The wiring member 11 and solar cells 10 are bonded using a resin adhesive. Specifically, the wiring member 11 and the solar cells 10 are bonded using an adhesive layer 12 including a cured resin adhesive. The adhesive layer 12 may be a cured anisotropic resin adhesive including a conductive material.

The resin adhesive is preferably an epoxy adhesive, an acrylic adhesive, or a silicon adhesive.

The solar cells 10 are provided in a bonding layer 13 filling the space between a first protecting member 14 and a second protecting member 15. The second protecting member 15 can be composed of a translucent member such as a translucent glass plate or plastic plate. The first protecting member 14 can be composed of a resin film or resin films between which a metal foil is interposed. The bonding layer 13 can be composed of a resin such as an ethylene-vinyl acetate (EVA) copolymer or polyvinyl butyral (PVB).

The following is an explanation of an example of a manufacturing method for a solar module 1.

First, a plurality of solar cells 10 and a plurality of wiring members 11 are prepared. Next, the solar cells 10 are connected electrically using a wiring member 11. Afterwards, a plurality of solar cells 10 connected electrically by a wiring member 11 are sealed between a first protecting member 14 and a second protecting member 15 using a bonding layer 13. More specifically, a resin sheet such as an EVA sheet is placed on the second protecting member 15. The solar cells 10 are arranged on the resin sheet. Another resin sheet such as an EVA sheet is placed thereupon, and a first protecting member 14 is placed on top of this. These are thermally bonded and laminated under heat and pressure in a reduced-pressure environment to complete the solar module 1.

The following is an explanation of a step in which a solar cell 10 and wiring member 11 are bonded using a resin adhesive.

In the present embodiment, a heat and pressure applying step is performed in which heat and pressure are applied to an opposing solar cell 10 and wiring member 11 with a resin adhesive interposed between them. After the completion of the heat and pressure applying step, a cooling step is performed in which the solar cell 10 and the wiring member 11 are cooled while being subjected to pressure. Cooling includes both cooling using an active cooling mechanism and cooling in which contact with a member or atmosphere having a relatively low-temperature causes heat to dissipate.

Figure 2:
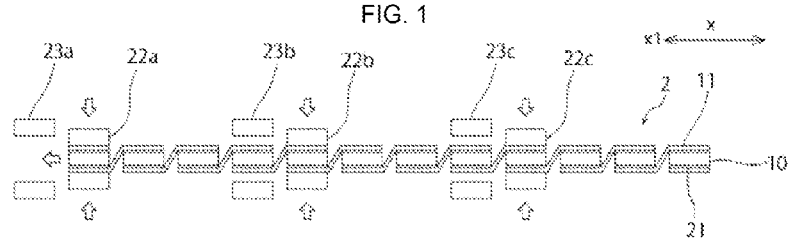
FIG. 2 is a simplified side view showing a manufacturing step of the solar module in the embodiment.

More specifically, a portion of one side of a wiring member 11 is arranged on a solar cell 10 with a resin adhesive 21 interposed between them. Temporary bonding is then performed on the solar cell 10 and the wiring member 11 (temporary bonding step) in which less heat and pressure is applied than in the main bonding step. The temporary bonding step is repeated to create a solar cell string 2 with a plurality of solar cells 10 as shown in FIG. 2. In the example explained here, there are twelve solar cells 10 in the solar cell string 2.

Next, the main bonding step is performed. More specifically, heat and pressure are applied to solar cells 10 and wiring members 11 using heated heating tools 22a-22c (heat and pressure applying step). Even more specifically, among the twelve solar cells 10 in the solar cell string 2, heat and pressure are applied to the 1st, 5th and 9th solar cells 10, wiring members 11, and resin adhesive 21 from side x1 in array direction x.

The temperature of the heating tool 22a-22c in the heat and pressure applying step can be set as appropriate in accordance with the type of resin adhesive 21 being used. For example, when the resin adhesive 21 is an epoxy adhesive, the temperature of the heating tools 22a-22c in the heat and pressure applying step can be set from 140° C. to 230° C. The pressing pressure applied in the heat and pressure applying step can be set from 0.01 MPa to 3.0 MPa. The pressing time in the heat and pressure applying step can be set from 2 seconds to 20 seconds.

There are no restrictions on the heating method used by the heating tools 22a-22c. A resistance heating method or pulse heating method may be used.

Figure 3:
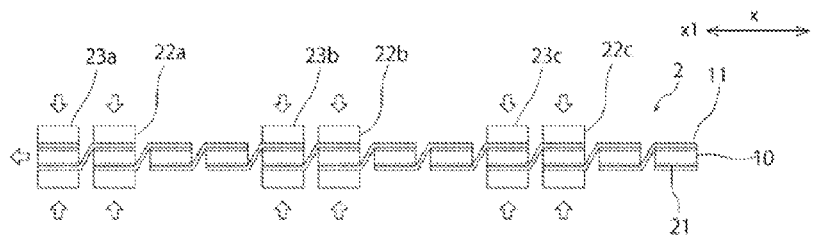
FIG. 3 is a simplified side view showing a manufacturing step of the solar module in the embodiment.

Next, the solar cells 10 and wiring members 11 subjected to heat and pressure are removed from the heating tools 22a-22c. Afterwards, as shown in FIG. 3, the solar cell string 2 is moved towards the x1 side in the array direction x relative to the heating tools 22a-22c. After they have been moved, the solar cells 10 and wiring members 11 are cooled under pressure by the cooling tools 23a-23c arranged on the x1 side of the heating tools 22a-22c. The cooling tools 23a-23c can be metal plates not equipped with a heating means.

Pressure is applied by the cooling tools 23a-23c until the temperature of the resin adhesive (adhesive layer 12) is preferably 60° C. or less, and more preferably 40° C. or less. The pressure applied by the cooling tools 23a-23c can be from 0.01 MPa to 2.0 MPa.

Figure 4:
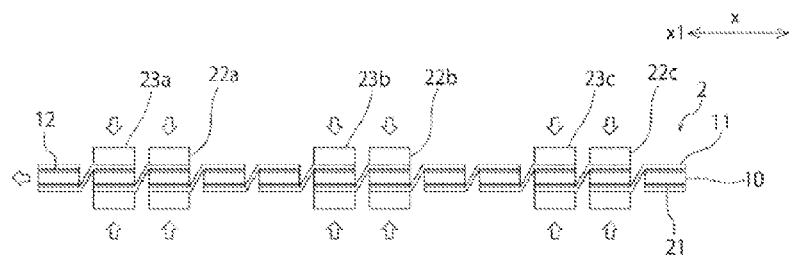
FIG. 4 is a simplified side view showing a manufacturing step of the solar module in the embodiment.

In the present embodiment, the heat and pressure applying step is performed by the heating tools 22a-22c on the solar cells 10 and wiring members 11 in the 2nd, 6th and 10th positions from the x1 side while the cooling step is being performed on the solar cells 10 and wiring members 11 in the 1st, 5th and 9th positions from the x1 side. Afterwards, the solar cell string 2 is moved towards the x1 side in array direction x relative to the heating tools 22a-22c. After the solar cell string 2 has been moved, as shown in FIG. 4, the heat and pressure applying step is performed on the solar cells 10 and wiring members 11 in the 3rd, 7th and 11th positions from the x1 side while the cooling step is being performed on the solar cells 10 and wiring members 11 in the 2nd, 6th and 10th positions from the x1 side.

Next, the solar cell string 2 is moved towards the x1 side in array direction x relative to the heating tools 22a-22c. After the solar cell string 2 has been moved, the cooling step is performed on the solar cells 10 and wiring members 11 in the 3rd, 7th and 11th positions from the x1 side, and the heat and pressure applying step is performed on the solar cells 10 and wiring members 11 in the 4th, 8th and 12th positions from the x1 side.

Next, the solar cell string 2 is moved towards the x1 side in array direction x relative to the heating tools 22a-22c. After the solar cell string 2 has been moved, the cooling step is performed on the solar cells 10 and wiring members 11 in the 4th, 8th and 12th positions from the x1 side. At this time, the heat and pressure applying step is not performed on the solar cells 10 and the wiring members 11 in the 5th and 9th positions from the x1 side. This is because these solar cells and wiring members have already been subjected to the heat and pressure applying step. Here, the heating tools 22a-22c may simply not be heated.

In such a way, the solar cells 10 and wiring members 11 are bonded.

In the present embodiment, as explained above, after solar cells 10 and wiring members 11 have been subjected to the heat and pressure applying step, they are subjected to a cooling step in which they are cooled under pressure. This can reduce the stress applied to the wiring members 11 and adhesive layers 12 when thermally expanded wiring members 11 contract during cooling. As a result, the residual stress that occurs in a solar string 2 due to the difference in thermal expansion coefficients between solar cells 10 and wiring members 11 can be reduced. In this way, solar modules 1 with improved reliability and output characteristics can be manufactured with higher yields. Warping of solar cells 10 can also be suppressed.

From the standpoint of realizing improved reliability and further suppressing warping of solar cells 10, pressure is applied to the solar cells 10 and wiring members 11 during cooling until the temperature of the resin adhesive (adhesive layer 12) is preferably 60° C. or less, and more preferably 40° C. or less.

The step in which pressure is applied by the cooling tools 23a-23c may occur any time from the beginning to the end of the cooling step. However, it preferably occurs as soon as the cooling step begins, as in the embodiment described above. This increases the cooling temperature per unit of time, and has a greater effect. This also reduces the amount of time needed to perform the cooling step, and improves productivity. Another cooling step may be performed in addition to this cooling step in which pressure is not applied while cooling the solar cells 10 and wiring members 11.

However, it is also possible to cool the solar cell 10 and the wiring member 11 by reducing the temperature of the heating tools 22a-22c while pressure is applied by the heating tools 22a-22c. In this case, the pressure can begin without delay at the start of the cooling step. Separate cooling tools 23a-23c are not required. However, when the heating tools 22a-22c are used, the cooling process requires a long time. Also, the cooled heating tools 22a-22c have to be reheated before the next heat and pressure application step can begin. In addition, the heating tools 22a-22c cannot be used to apply heat and pressure to another solar cell 10 and wiring member 11 until the cooling step has ended. This reduces the production efficiency of solar modules 1.

In the present embodiment, pressure is applied during cooling by cooling tools 23a-23c that are separate from the heating tools 22a-22c used in the heat and pressure applying step. This can reduce the amount of time required to complete the cooling step, and the heating tools 22a-22c do not have to be cooled and reheated. Heat and pressure can also be applied to another solar cell 10 and wiring member 11 using the heating tools 22a-22c while the cooling step is being performed. As a result, solar modules 1 can be manufactured with improved production efficiency.

In the present embodiment, the heat and pressure applying step can be performed on one solar cell 10 and wiring member 11 in parallel with the cooling step being performed on another solar cell 10 among a plurality of solar cells 10. As a result, solar modules 1 can be manufactured with even better production efficiency.

The following is a detailed explanation of the present invention with reference to a specific example. The present invention is not limited by the following example in any way, and may be embodied with suitable changes within a range that does not change the intention of the invention.

EXAMPLE

Figure 5:
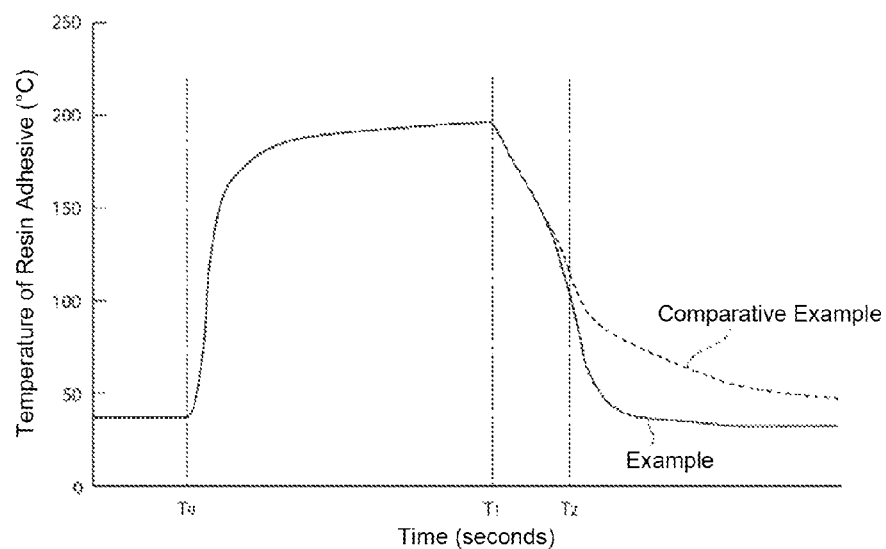
FIG. 5 is a graph showing the change in the temperature of the resin adhesive in an example and a comparative example. The solid line in the graph represents the example, and the broken line in the graph represents the comparative example.

A solar module was manufactured using a manufacturing method similar to the manufacturing method explained in the embodiment. The change in the temperature of the resin adhesive in the example is indicated by the solid line in FIG. 5.

The wiring member was applied to one side of a solar cell, and the maximum amount of warping was measured. The amount of warping of the solar cell in the results was approximately 5 mm. The main conditions under which the solar module was manufactured were as follows.

Solar cell shape dimensions: 125 mm×125 mm
Type of resin adhesive: epoxy resin adhesive
Glass transition temperature of resin adhesive: 160° C.
Temperature of heating tool: 220° C.
Pressure during application of heat and pressure: 0.2 MPa
Heat and pressure application time (T1-T0): 10 sec
Pressure during cooling: 0.1 MPa
Temperature of resin adhesive at start of pressure during cooling: 150° C.
Temperature of resin adhesive at end of pressure during cooling: 60° C.
Cooling tool pressure application time $(T_2-T_1)$: 5 sec

COMPARATIVE EXAMPLE

A solar module was manufactured in the same manner as the example except that pressure was not applied by a cooling tool. The change in temperature of the resin adhesive in the comparative example is indicated by the broken line in FIG. 5.

The maximum amount of warping of a single solar cell was measured in the same manner as the example. The amount of warping of the solar cell in the results was approximately 10 mm.

It is clear from these results that warping of a solar cell can be suppressed by applying pressure to the solar cell and the wiring member in at least a portion of the cooling step. It is also clear that rapid cooling and improved productivity are possible.

The present invention includes many embodiments not described herein. For example, the same tool may be used to apply pressure during the heat and pressure applying step and to apply pressure during the cooling step. In this case, the tool heating method is preferably the pulse heating method. This enables the heating and cooling of the tool to be performed in a short period of time.

The solar cell and wiring member may be bonded using only a main bonding step without a temporary bonding step.

Also, a separate cooling means such as an air blower may be provided in the cooling step.

The present invention includes many other embodiments not described herein. Therefore, the technical scope of the present invention is defined solely by the items of the invention specified in the claims pertinent to the above explanation.

KEY TO THE DRAWINGS

1: Solar module
10: Solar cell
11: Wiring member
12: Adhesive layer
21: Resin adhesive
22a-22c: Heating tools
23a-23c: Cooling tools

What is claimed is:

1. A method for manufacturing a solar module equipped with solar cells connected electrically by a wiring member, the method comprising:
   an electrical connecting step in which the solar cells are connected electrically by the wiring member, the electrical connecting step comprising
      a heat and pressure applying step for applying heat and pressure to the opposing solar cells and wiring member with a resin adhesive interposed therebetween;
   and a cooling step for cooling the solar cell and wiring member under pressure after the heat and pressure applying step has been performed and
      a sealing step in which the solar cells connected electrically by the wiring member are arranged between a first protecting member and a second protecting member, wherein the solar cells, the first protective member and the second protective member are thermally bonded and laminated under heat and pressure in a reduced-pressure environment.

2. The method for manufacturing a solar module according to claim 1, wherein heat and pressure are applied to the solar cell and the wiring member using a heated heating tool in the heat and pressure applying step, and
   cooling is performed under pressure by a cooling tool separate from the heating tool in the cooling step.

3. The method for manufacturing a solar module according to claim 1, wherein pressure is applied to the solar cell and the wiring member in the cooling step until the temperature of the resin adhesive is 60° C. or less.

4. The method for manufacturing a solar module according to claim 1, wherein the solar module is equipped with a plurality of solar cells, and
   the heat and pressure applying step is performed on one portion of the plurality of solar cells and the wiring member in parallel with the cooling step being performed on another portion of the plurality of solar cells.

5. A method for manufacturing a solar module equipped with solar cells connected electrically by a wiring member, the method comprising:
   a step of applying heat and pressure individually to each solar cell and wiring member with a resin adhesive interposed therebetween with a metal surface tool; and a cooling step that individually cools each solar cell and wiring member under pressure after the heat and pressure applying step.

6. The method for manufacturing a solar module according to claim 5, wherein cooling is performed under pressure by a cooling tool separate from the heating tool, in the cooling step.

7. The method for manufacturing a solar module according to claim 5, wherein pressure is applied to the solar cell and the wiring member in the cooling step until the temperature of the resin adhesive is 60° C. or less.

* * * * *